United States Patent
Cho et al.

(10) Patent No.: US 11,502,055 B2
(45) Date of Patent: Nov. 15, 2022

(54) ASSEMBLY APPARATUS FOR ASSEMBLING SEMICONDUCTOR LIGHT EMITTING DIODE TO DISPLAY PANEL

(71) Applicant: LG ELECTRONICS INC., Seoul (KR)

(72) Inventors: Hyunwoo Cho, Seoul (KR); Bongchu Shim, Seoul (KR); Dohee Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 390 days.

(21) Appl. No.: 16/689,810

(22) Filed: Nov. 20, 2019

(65) Prior Publication Data

US 2020/0279826 A1 Sep. 3, 2020

(30) Foreign Application Priority Data

Feb. 28, 2019 (KR) .................. 10-2019-0024227

(51) Int. Cl.
*H01L 23/00* (2006.01)
*H01L 25/075* (2006.01)
*H01L 33/00* (2010.01)

(52) U.S. Cl.
CPC .......... *H01L 24/75* (2013.01); *H01L 25/0753* (2013.01); *H01L 33/0093* (2020.05); *H01L 2224/75655* (2013.01); *H01L 2224/75723* (2013.01); *H01L 2224/75735* (2013.01)

(58) Field of Classification Search
CPC ... H01L 2924/00014; H01L 2224/2929; H01L 2224/293; H01L 2224/83203; H01L 2224/95; H01L 2224/83; H01L 2224/16238; H01L 2224/32225

See application file for complete search history.

(56) References Cited

U.S. PATENT DOCUMENTS

| | | | |
|---|---|---|---|
| 8,119,427 B1 | 2/2012 | Lu | |
| 9,093,629 B2* | 7/2015 | Rhee | ............. H05K 3/323 |
| 10,418,527 B2* | 9/2019 | Sasaki | ............. H01L 33/486 |
| 2006/0057293 A1 | 3/2006 | Sharma et al. | |
| 2006/0220988 A1 | 10/2006 | Hillis et al. | |
| 2013/0210194 A1* | 8/2013 | Bibi | ............. H01L 24/75 |
| | | | 438/107 |
| 2018/0240937 A1 | 8/2018 | Park et al. | |
| 2020/0279826 A1* | 9/2020 | Cho | ............. H01L 33/0093 |

FOREIGN PATENT DOCUMENTS

| | | |
|---|---|---|
| JP | 2002-198381 A | 7/2002 |
| JP | 2018-61017 A | 4/2018 |
| KR | 10-2017-0124282 A | 11/2017 |
| WO | WO 2017/034268 A1 | 3/2017 |

* cited by examiner

Primary Examiner — Minh N Trinh
(74) Attorney, Agent, or Firm — Birch, Stewart, Kolasch & Birch, LLP

(57) ABSTRACT

Discussed is an assembly apparatus for assembling a semiconductor light emitting diode to a display panel, the assembly apparatus including an assembly module including at least one magnetic member and a magnetic member accommodator having at least one magnetic member accommodation hole, and a rotary module connected to the assembly module to rotate the assembly module along an orbit.

17 Claims, 16 Drawing Sheets

(a)

(b)

ASSEMBLY APPARATUS FOR ASSEMBLING SEMICONDUCTOR LIGHT EMITTING DIODE TO DISPLAY PANEL

CROSS-REFERENCE TO RELATED APPLICATIONS

The present application claims priority under 35 U.S.C. 119 and 35 U.S.C. 365 to Korean Patent Application No. 10-2019-0024227 (filed on Feb. 28, 2019), which is hereby incorporated by reference in its entirety.

FIELD

The present disclosure relates to an assembly apparatus for assembling a semiconductor light emitting diode to a display panel.

BACKGROUND

Recently, displays having excellent characteristics such as a thin shape and flexibility have been developed in the display technology field. On the other hand, an LCD (Liquid Crystal Display) and AMOLED (Active Matrix Organic Light Emitting Diodes) are representative of main displays that are commonly used now.

However, the LCD has a problem that a response time is not short and it is difficult to implement flexibility and AMOLED has a defect that the lifespan is short and the yield is not good.

Meanwhile, a light emitting diode (LED), which is a well-known semiconductor device that converts a current into light, has been used as a light source for displaying images in electronic devices including information devices together with a green LED based on GaP:N since a red LED using a GaAsP compound semiconductor was commercialized in 1962. Accordingly, a plan that solves the problems by implementing a display using the semiconductor LED may be proposed. Such an LED has the advantage of a long lifespan, low power consumption, an excellent initial driving characteristic, high vibration resistance, etc, as compared with a filament-based light emitting element.

Meanwhile, according to a display that uses semiconductor light emitting diodes, it is required to couple semiconductor light emitting diodes respectively corresponding to pixels to a substrate, so it may be relatively difficult to implement a display having a large screen and many pixels. Accordingly, recently, a self-assembling method of moving LEDs put in fluid to a substrate, using an electromagnetic field, and then assembling them is being developed.

SUMMARY

An objective of the present disclosure is to provide an assembly apparatus that can reduce time that is taken to assemble semiconductor light emitting diodes to a panel.

Another objective of the present disclosure is to provide an assembly apparatus that can prevent a decrease in assembly yield due to bending of a display panel when a large-area display is manufactured.

An assembly apparatus for assembling a semiconductor light emitting diode to a display panel according to an embodiment of the present disclosure includes: an assembly module including at least one magnetic member coming in contact with a surface of the display, and a magnetic member accommodator having at least one magnetic member accommodation hole; and a rotary module connected to the assembly module and configured to rotate the assembly module along an orbit on the basis of a driving force transmitted from an external driving source.

According to an embodiment, the at least one magnetic member of the assembly module may protrude downward from the magnetic member accommodator through the at least one magnetic member accommodation hole.

According to an embodiment, in the magnetic member, the radius of a first portion accommodated in the magnetic member accommodation hole may be larger than the radius of a second portion protruding downward from the magnetic member accommodation hole.

According to an embodiment, at least one protrusion protruding from an inner circumferential surface may be formed at a lower portion of the magnetic member accommodation hole.

According to an embodiment, a lower inner diameter of the magnetic member accommodation hole based on the at least one protrusion may be smaller than the radius of the first portion of the magnetic member.

According to an embodiment, the assembly module may further include a magnetic member fixing plate accommodated in an accommodation space recessed on an upper portion of the magnetic member accommodator, and the magnetic member fixing plate may be made of metal.

According to an embodiment, the assembly module may further include at least one fixing magnetic member accommodated in the at least one magnetic member accommodation hole and attached to a bottom of the magnetic member fixing plate.

According to an embodiment, the at least one magnetic member may be positioned under the at least one fixed magnetic member, and the at least one magnetic member and the at least one fixed magnetic member may have the same polarity on surfaces thereof facing each other.

According to an embodiment, the at least one magnetic member may be moved up and down on the basis of repulsion by the at least one fixed magnetic member and external force.

According to an embodiment, the assembly module may further include a housing fastened to an upper portion of the magnetic member accommodator and at least one shaft fastened between the housing and the rotary module.

According to an embodiment, the rotary module may include: a bar connected to the external driving source; a main gear to which the bar is fixed; at least one auxiliary gear geared with the main gear; and at least one connection shaft fixed to the at least one auxiliary gear, and the at least one shaft is connected with the at least one connection shaft.

According to an embodiment, the at least one shaft may be connected with the at least one connection shaft to be spaced apart from a rotational center of the at least one connection shaft.

According to an embodiment, a fastening groove in which the at least one shaft is inserted may be formed at a lower portion of the at least one connection shaft. A center of the fastening groove may be spaced apart from a rotational axis of the connection shaft.

DETAILED DESCRIPTION

Figure 1:
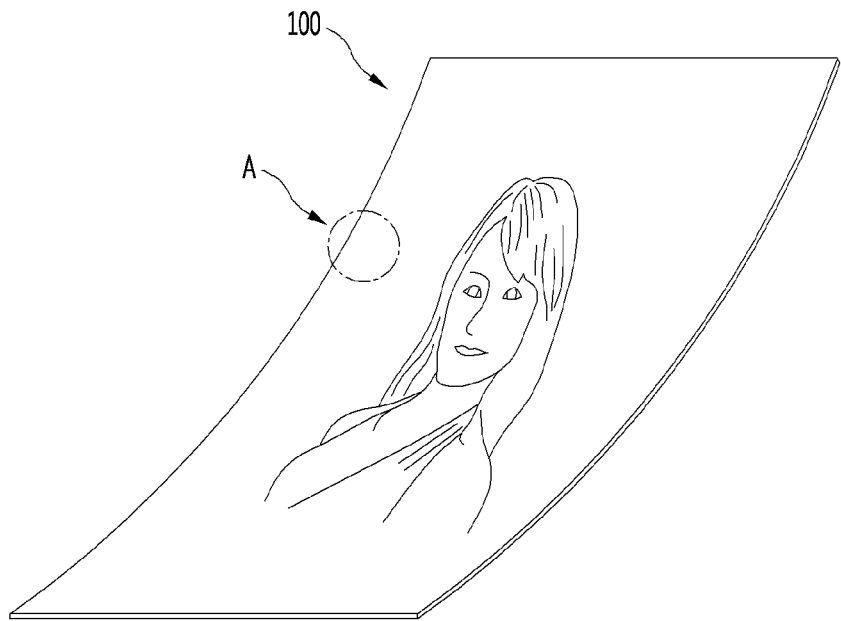
FIG. 1 is a conceptual view showing an embodiment of a display using a semiconductor light emitting diode of the present disclosure.

Hereafter, embodiments of the present disclosure will be described in detail with reference to the accompanying drawings and the same or similar components are given the same reference numerals regardless of the numbers of figures and are not repeatedly described. Terms "module" and "unit" that are used for components in the following description are used only for the convenience of description without having discriminate meanings or functions. In the following description, if it is decided that the detailed description of known technologies related to the present disclosure makes the subject matter of the embodiments described herein unclear, the detailed description is omitted. Further, it should be noted that the accompanying drawings are provided only for easy understanding of the embodiments disclosed herein and the spirit of the present disclosure should not be construed as being limited to the accompanying drawings.

When an element such as a layer, a region, or a substrate is referred to as being "on," another element, it may be directly on the other element, or an intervening element may be present therebetween.

A display described herein may include a mobile phone, a smart phone, a laptop computer, a digital broadcasting terminal, a PDA (personal digital assistants), a PMP (portable multimedia player), a navigation, a slate PC, a tablet PC, a ultra book, a digital TV, a desktop computer, etc. However, it would be easily understood by those skilled in the art that the configuration according to embodiments described here may be applied to devices that can be equipped with a display, even if the devices are new types of products that will be developed in future.

Before an assembly apparatus for assembling a semiconductor light emitting diode to a display panel (substrate) according to an embodiment of the present disclosure is described, a semiconductor light emitting diode and a display using the semiconductor light emitting diode are described.

FIG. 1 is a conceptual diagram showing an embodiment of a display using a semiconductor light emitting diode of the present disclosure.

Referring to the figure, information that is processed by a controller of a display 100 can be displayed using a flexible display.

The flexible display includes displays that can be bent, curved, twisted, folded, and rolled by external force. For example, the flexible display may be a display that is manufactured on a thin and flexible substrate, which can be bent, curved, folded, or rolled like paper, while maintaining the display characteristics of existing flat panel display.

In a state in which the flexible display is not bent (e.g., in which the flexible display has an infinite radius of curvature, which is referred to as a 'first state' hereafter), the display region of the flexible display becomes a flat surface. In a state in which the flexible display is bent from the first state by external force (e.g., in which the flexible display has a finite radius of curvature, which is referred to as a 'second state' hereafter), the display region may be a curved surface. As shown in the figure, the information that is displayed in the second state may be visual information that is output on the curved surface. Such visual information is implemented by individual control of light emission of sub-pixels disposed in a matrix type. The sub-pixel means a minimum unit for implementing one color.

The sub-pixels of the flexible display can be implemented by a semiconductor light emitting diode. A light emitting diode (LED) that is a kind of semiconductor light emitting diode converting a current into light is exemplified in the present disclosure. The light emitting diode is formed in a small size, so it can function as a sub-pixel even in the second state.

Hereafter, a flexible display implemented using the light emitting diode is described in more detail with reference to drawings.

Figure 2:
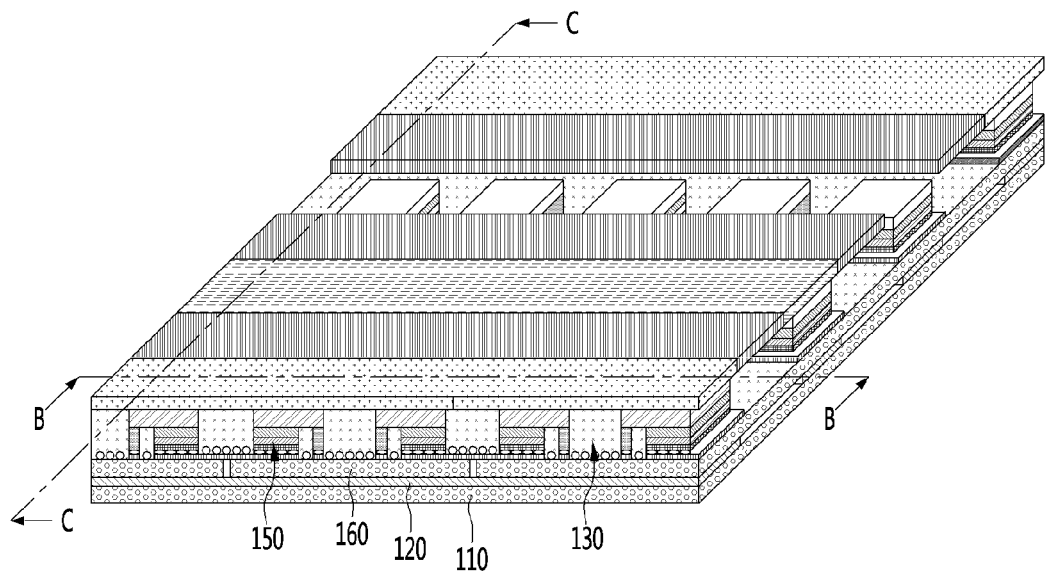
FIG. 2 is a partial enlarged view of the part A of FIG. 1 and FIGS. 3A and 3B are cross-sectional views taken along line B-B and C-C of FIG. 2.
Figure 3A:
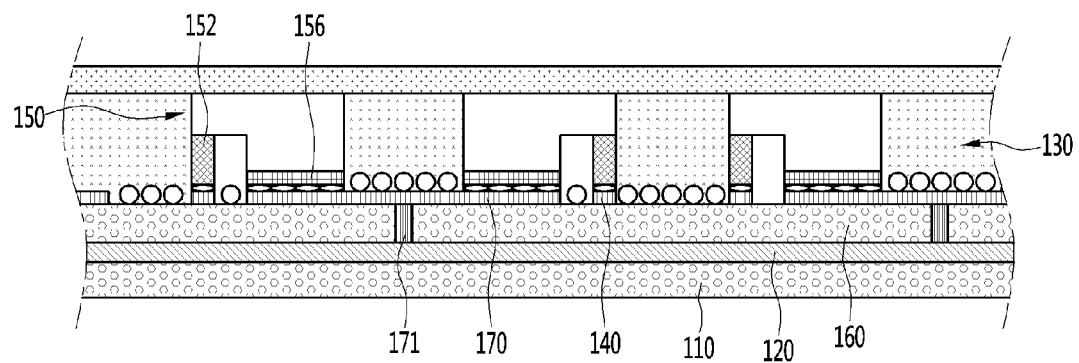
Figure 3B:
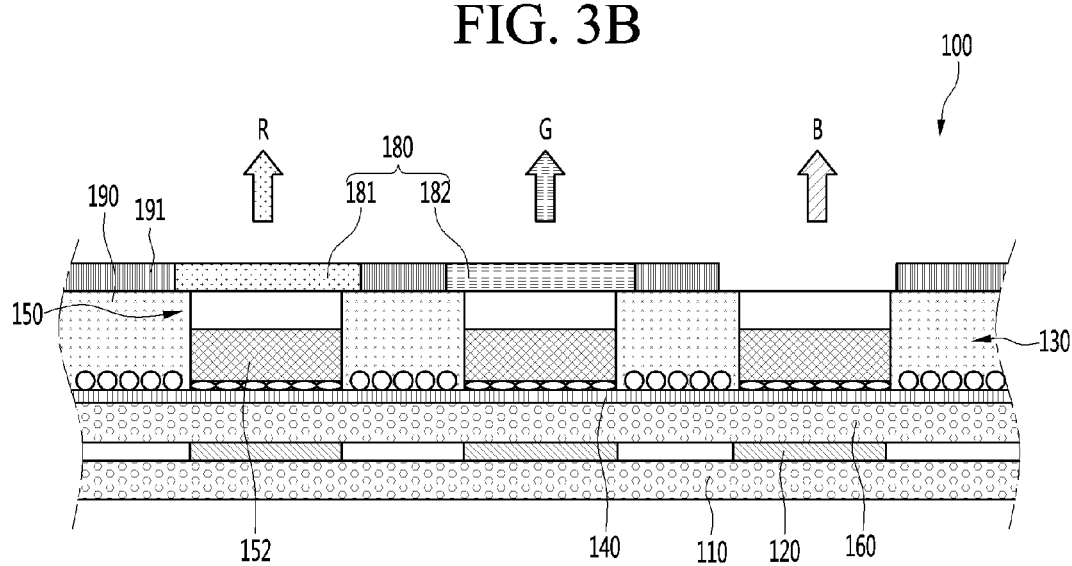
Figure 4:
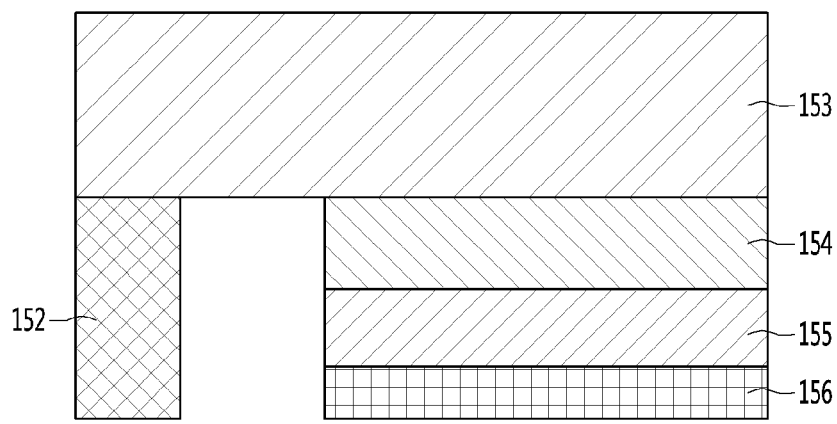
FIG. 4 is a conceptual view showing a flip-chip type semiconductor light emitting diode of FIG. 3.

FIG. 2 is a partial enlarged view of the portion A of FIG. 1, FIGS. 3A and 3B are cross-sectional views taken along lines B-B and C-C of FIG. 2, FIG. 4 is a conceptual view showing a flip-chip type semiconductor light emitting diode of FIG. 3A, and FIGS. 5A to 5C are conceptual views showing various types that implement colors in relation to a flip-chip type semiconductor light emitting diode.

According to FIGS. 2, 3A, and 3B, as a display 100 using a semiconductor light emitting diode, a display 100 using a passive matrix (PM) type of semiconductor light emitting diode is exemplified. However, examples to be described hereafter can be applied also to an active matrix (AM) type of semiconductor light emitting diode.

The display 100 includes a first substrate 110, a first electrode 120, a conductive adhesive layer 130, a second electrode 140, and a plurality of semiconductor light emitting diodes 150.

The substrate 110 may be a flexible substrate. For example, the substrate 110 may include glass or polyimide (PI) to implement a flexible display. Further, any materials may be used as long as they have insulation and flexibility such as PEN (Polyethylene Naphthalate) and PET (Polyethylene Terephthalate). Further, the substrate 110 may be made of any one of a transparent material or an opaque material.

The substrate 110 may be a wiring board on which the first electrode 120 is disposed, so the first electrode 120 may be positioned on the substrate 110

According to the drawings, an insulating layer 160 may be disposed over the substrate 110 on which the first electrode 120 is positioned, and an auxiliary electrode 170 may be positioned on the insulating layer 160. In this case, the state in which the insulating layer 160 is stacked on the substrate 110 may be one wiring board. In more detail, the insulating layer 160 may be made of an insulating and flexible material, such as PI (Polyimide), PET, and PEN, integrally with the substrate 110, thereby forming one substrate.

The auxiliary electrode 170, which is an electrode electrically connecting the semiconductor light emitting diodes 150, is positioned on the insulating layer 160 and disposed to correspond to the first electrode 120. For example, the auxiliary electrode 170 has a dot shape and can be electrically connected with the first electrode 120 by electrode holes 171 formed through the insulating layer 160. The electrode hole 171 may be formed by filing a via hole with a conductive material.

Referring to the figures, the conductive adhesive layer 130 is formed on a surface of the insulating layer 160, but the present disclosure is not necessarily limited thereto. For example, a structure, in which a layer performing a specific function is formed between the insulating layer 160 and the conductive adhesive layer 130 or the conductive adhesive layer 130 is disposed on the substrate 110 without the insulating layer 160, is possible. In the structure in which the conductive adhesive layer 130 is disposed on the substrate 110, the conductive adhesive layer 130 can function as an insulating layer.

The conductive adhesive layer 130 may be a layer having an adhesive property and conductivity, and to this end, a substance having conductivity and a substance having an adhesive property may be mixed in the conductive adhesive layer 130. Further, the conductive adhesive layer 130 has ductility, so it enables the flexible function of the display.

As an example of this case, the conductive adhesive layer 130 may be an anisotropy conductive film (ACF), an anisotropy conductive paste, and a solution containing conductive particles. The conductive adhesive layer 130 may be configured as a layer that allows for electrical connection in a Z direction passing through the thickness, but has electrical insulation in the horizontal X-Y direction. Accordingly, the conductive adhesive layer 130 may be referred to as a Z-axial conductive layer (however, hereafter, referred to as a 'conductive adhesive layer').

The anisotropic conductive film is a film in which an anisotropic conductive medium is mixed in an insulating base member, and only a specific portion is given conductivity by the anisotropic conductive medium when heat and pressure are applied. It is assumed in the following description that heat and pressure are applied to the anisotropic conductive film, but other methods are also possible so that the anisotropic conductive film partially has conductivity. These methods, for example, may be a case of applying only any one of heat and pressure or a case of UV curing.

Further, the anisotropic conductive medium, for example, may be a conductive ball or a conductive particle. According to the figures, in this embodiment, the anisotropic conductive film is a film in which conductive balls are mixed in an insulating base member, and only a specific portion is given conductivity by the conductive balls when heat and pressure are applied. The anisotropic conductive film may be in a state in which a plurality of particles coated with an insulating film made of a polymer material is contained in a core made of a conductive substance, and in this case, when heat and pressure are applied a portion, the insulating film is broken at the portion and the portion is given conductivity by the core. In this case, the shape of the core is deformed, so layers that are in contact with each other in the thickness direction of the film may be formed. As a more detailed example, heat and pressure are applied throughout the anisotropic conductive film and Z-axial electrical connection is partially formed by the height difference of an object that is bonded by the anisotropic conductive film.

As another example, the anisotropic conductive film may be in a state in which a plurality of particles coated with a conductive substance is contained in an insulating core. In this case, when heat and pressure are applied to a portion, the conductive substance at the portion is deformed (gets scored and sticks), so the portion is given conductivity in the thickness direction of the film. As another example, the conductive substance may pass through the insulating base member in the Z-axial direction to show conductivity in the thickness direction of the film. In this case, the conductive substance may have a pointed end.

According to the figures, the anisotropic conductive film may be a fixed array ACF in which conductive balls are inserted in a surface of an insulating base member. In more detail, the insulating base member is made of an adhesive substance, the conductive balls are concentrated at the bottom of the insulating base member, and when heat and pressure are applied to the base member, the base member is deformed with the conductive balls, thereby being given vertical conductivity.

However, the present disclosure is not limited thereto, and the anisotropic conductive film may be configured in a type in which conductive balls are randomly mixed in an insulating base member or a type in which a plurality of layers is provided and conductive balls are disposed in any one layer (double-ACF).

The anisotropic conductive paste is formed by combining a paste and conductive balls, and may be a paste in which conductive balls are mixed in an insulating and adhesive base substance. Further, the solution containing conductive particles may be a solution containing conductive particles or nano particles.

Referring to figures again, the second electrode 140 is spaced apart from the auxiliary electrode 170 and positioned on the insulating layer 160. That is, the conductive adhesive layer 130 is disposed on the insulating layer 160 on which the auxiliary electrode 170 and the second electrode 140 are positioned.

When the conductive adhesive layer 130 is formed in a state in which the auxiliary electrode 170 and the second electrode 140 are positioned on the insulating layer 160, and then the semiconductor light emitting diode 150 is connected in a flip-chip type by applying heat and pressure, the semiconductor light emitting diode 150 is electrically connected with the first electrode 120 and the second electrode 140.

Referring to FIG. 4, the semiconductor light emitting diode may be a flip-chip type light emitting diode.

For example, the semiconductor light emitting diode includes a p-type electrode 156, a p-type semiconductor layer 155 on which the p-type electrode 156 is formed, an active layer 154 formed on the p-type semiconductor layer 155, an n-type semiconductor layer 153 formed on the active layer 154, and an n-type electrode 152 horizontally spaced apart from the p-type electrode 156 on the n-type semiconductor layer 153. In this case, the p-type electrode 156 can be electrically connected with the auxiliary electrode 170 by the conductive adhesive layer 130, and the n-type electrode 152 can be electrically connected with the second electrode 140.

Referring to FIGS. 2, 3A, and 3B again, the auxiliary electrode 170 is elongated in one direction and at least one auxiliary electrode can be electrically connected with a plurality of semiconductor light emitting diodes 150. For example, the p-type electrodes of semiconductor light emitting diodes at left and right sides from an auxiliary electrode can be electrically connected with one auxiliary electrode.

In more detail, the semiconductor light emitting diode 150 is pressed into the conductive adhesive layer 130 by heat and pressure, so only the portion between the p-type electrode 156 of the semiconductor light emitting diode 150 and the auxiliary electrode 170 and the portion between the n-type electrode 152 of the semiconductor light emitting diode 150 and the second electrode 140 have conductivity, and the other portions do not have conductivity because the semiconductor light emitting diode is pressed inside. As described above, the conductive adhesive layer 130 not only couples, but also electrically connects the portion between the semiconductor light emitting diode 150 and the auxiliary electrode 170 and the portion between the semiconductor light emitting diode 150 and the second electrode 140.

Further, the plurality of semiconductor light emitting diodes 150 constitutes a light emitting diode array, and a fluorescent layer 180 is formed on the light emitting diode array.

The light emitting diode array may include a plurality of semiconductor light emitting diodes having different own luminance values. Each of the semiconductor light emitting diode 150 constitutes a sub-pixel and is electrically connected to the first electrode 120. For example, the first electrode 120 may be a plurality of pieces, the semiconductor light emitting diodes, for example, may be arranged in several lines, and the semiconductor light emitting diodes in each line may be electrically connected to any one of the plurality of first electrodes.

Further, since the semiconductor light emitting diodes are connected in a flip-chip type, it is possible to use grown semiconductor light emitting diodes for a transparent dielectric substrate. Further, the semiconductor light emitting diodes, for example, may be nitride semiconductor light emitting diodes. Since the semiconductor light emitting diode 150 has excellent luminance, it can constitute an individual sub-pixel even in a small size.

According to the figures, a separation wall 190 may be formed between the semiconductor light emitting diodes 150. In this case, the separation wall 190 can serve to separate individual sub-pixels and may be formed integrally with the conductive adhesive layer 130. For example, the semiconductor light emitting diodes 150 are inserted in the anisotropic conductive film, the base member of the anisotropic conductive film can form the separation wall.

Further, when the base member of the anisotropic conductive film is black, the separation wall 190 can have a reflective characteristic and the contrast can be increased even without a discrete black insulator.

As another example, a reflective separation wall may be provided as the separation wall 190. In this case, the separation wall 190 may include a black or white insulator, depending on the object of the display. When a separation wall of a white insulator is used, there can be an effect of increasing reflectivity, and when a separation wall of a black insulator, it is possible to have a reflective characteristic and increase contrast.

The fluorescent layer 180 may be positioned on the outer side of the semiconductor light emitting diode 150. For example, the semiconductor light emitting diode 150 is a blue semiconductor light emitting diode that emits blue light (B), and the fluorescent layer 180 performs a function of converting the blue light (B) into a color of a sub-pixel. The fluorescent layer 180 may be a red fluorescent body 181 or a green fluorescent body 182 that constitutes an individual pixel.

That is, the red fluorescent body 181 that can convert blue light into red light (R) may be stacked on a blue semiconductor light emitting diode at a position where a red sub-pixel is formed, and the green fluorescent body 182 that can convert blue light into green light (G) may be stacked on a blue semiconductor light emitting diode at a position where a green sub-pixel is formed. Further, only a blue semiconductor light emitting diode may be independently used a portion forming a blue sub-pixel. In this case, red (R), green (G), and blue (B) sub-pixels can form one pixel. In more detail, a fluorescent body having one color may be stacked along each line of the first electrode 120. Accordingly, in the first electrode 120, one line may be an electrode that controls one color. That is, red (R), green (G), and blue (B) may be sequentially disposed along the second electrode 140, whereby a sub-pixel can be implemented.

However, the present disclosure is not necessarily limited thereto, and red (R), green (G), and blue (B) sub-pixels may be implemented by combining the semiconductor light emitting diode 150 and a quantum dot (QD) instead of a fluorescent body.

Further, a black matrix 191 may be disposed between each of fluorescent bodies to improve contrast. That is, the black matrix 191 can improve the contrast of light and darkness.

However, the present disclosure is not necessarily limited thereto and another structure may be applied to implement blue, red, and green.

Figure 5A:
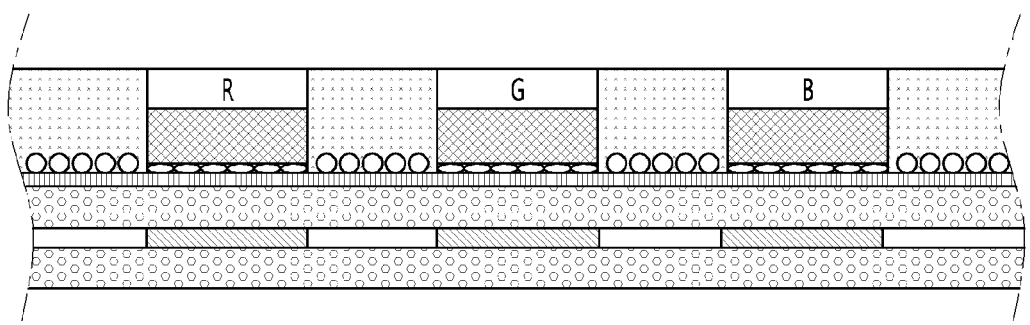
FIGS. 5A to 5C are conceptual views showing various types that implement colors in relation to a flip-chip type semiconductor light emitting diode.

Referring to FIG. 5A, the semiconductor light emitting diodes 150 each may be implemented as a high-power light emitting diodes in which gallium nitride (GaN) is included as a main component and indium (In) and/or aluminum (Al) is added to emit various colors of light including blue.

In this case, the semiconductor light emitting diodes 150 may be red, green, and blue semiconductor light emitting diodes to from sub-pixels respectively. For example, red, green, and blue semiconductor light emitting diodes (R, G, B) are alternately disposed, and sub-pixels of red, green, and blue constitute one pixel by the red, green, and blue semiconductor light emitting diodes, whereby a full-color display can be implemented.

Figure 5B:
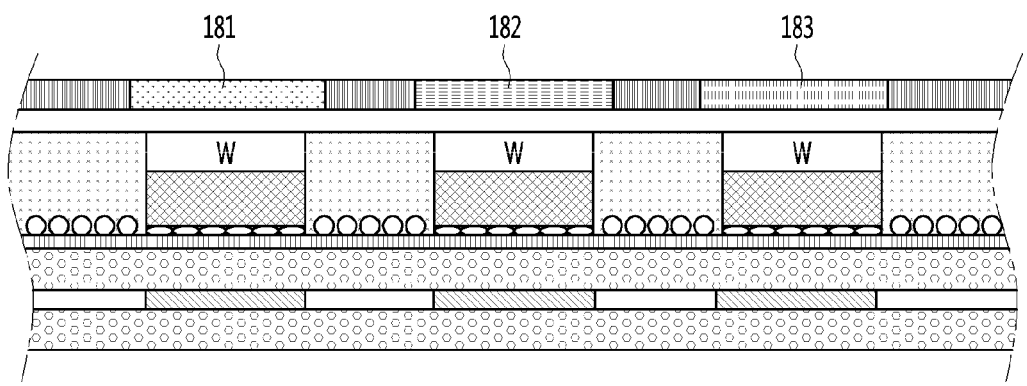

Referring to FIG. 5B, the semiconductor light emitting diode may have white light emitting diodes (W) each having a yellow fluorescent layer. In this case, in order to form a sub-pixel, a red fluorescent layer 181, a green fluorescent layer 182, and a blue fluorescent layer 183 may be disposed on the white light emitting diode (W). Further, a sub-pixel may be formed using a color filter in which red, green, and blue are repeated, on the white light emitting diode (W).

Figure 5C:
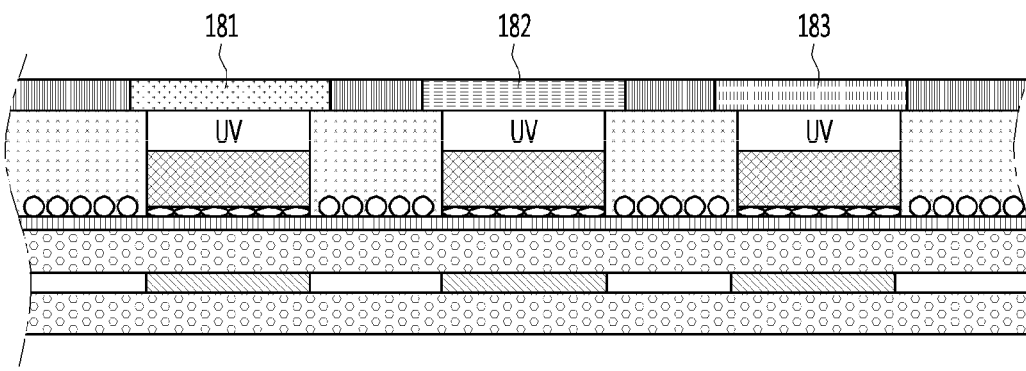

Referring to FIG. 5C, a structure in which a red fluorescent layer 181, a green fluorescent layer 182, and a blue fluorescent layer 183 are disposed on an ultraviolet light emitting diode (UV) may be possible. As described above, a semiconductor light emitting diode can be used in the entire region including not only the visual light, but also ultraviolet light (UV), and can be expanded in the type of a semiconductor light emitting diode that can use ultraviolet light (UV) as an excitation source of an upper fluorescent body.

Referring to this embodiment again, the semiconductor light emitting diode 150 is positioned on the conductive adhesive layer 130, thereby constituting a sub-pixel in the display. Since the semiconductor light emitting diode 150 has excellent luminance, it can constitute an individual sub-pixel even in a small size. The individual semiconductor light emitting diode 150 may have a size with one side of 80 µm or less and may be a rectangular or a square diode. When it is a rectangle, the size may be 20×80 µm or less.

Further, even using a square semiconductor light emitting diode 150 having one side length of 10 µm as a sub-pixel, sufficient brightness for forming a display is shown. Accordingly, for example, in a case in which the size of a sub-pixel is a rectangular pixel having one side of 600 µm and the other one side of 300 µm, the distance of a semiconductor light emitting diode is relatively sufficiently large. Accordingly, in this case, it is possible to implement a flexible display having high quality over HD quality.

The display using the semiconductor light emitting diode described above can be manufactured by a new type of manufacturing method. Hereafter, this manufacturing method is described with reference to FIG. 6.

Figure 6:
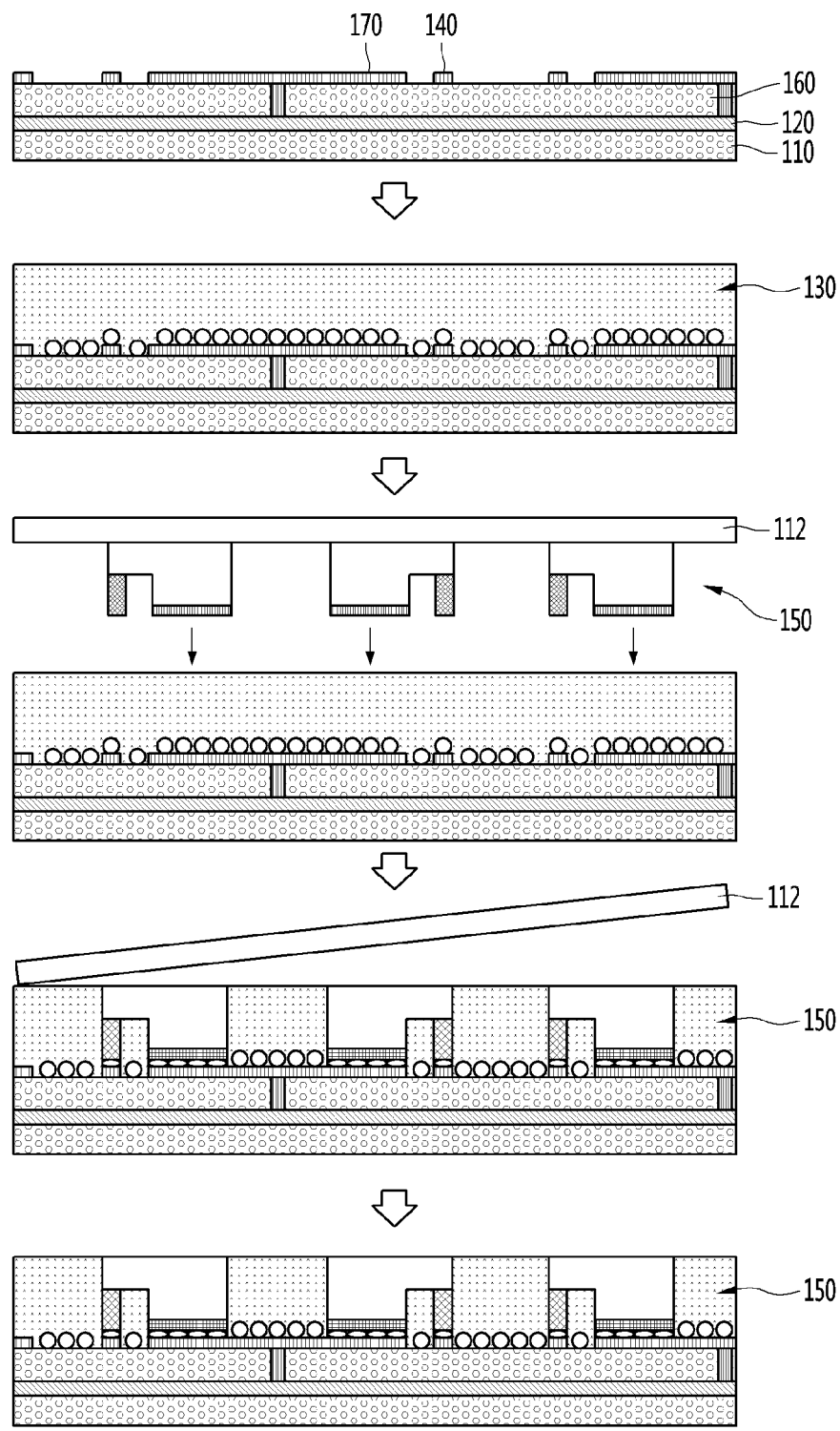
FIG. 6 shows cross-sectional views illustrating a method of manufacturing a display using a semiconductor light emitting diode of the present disclosure.

FIG. 6 shows cross-sectional views illustrating a method of manufacturing a display using a semiconductor light emitting diode of the present disclosure.

Referring to this figure, first, the conductive adhesive layer 130 is formed on the insulating layer 160 on which the auxiliary electrode 170 and the second electrode 140 are positioned. The insulating layer 160 is stacked on the first substrate 110, thereby forming one substrate (wiring board). Further, the first electrode 120, the auxiliary electrode 170, and the second electrode 140 are disposed on the wiring board. In this case, the first electrode 120 and the second electrode 140 may be disposed perpendicular to each other. Further, in order to implement a flexible display, the first substrate 110 and the insulating layer 160 each may include glass or polyimide (PI).

The conductive adhesive layer 130, for example, may be implemented by an anisotropic conductive film, and to this end, an anisotropic conductive film may be applied to a substrate on which the insulating layer 160 is positioned.

Next, a second substrate 112 on which a plurality of semiconductor light emitting diodes 150, which correspond to the positions of the auxiliary electrodes 170 and the second electrodes 140 and constitute individual pixels, is positioned is disposed such that the semiconductor light emitting diodes 150 face the auxiliary electrodes 170 and the second electrodes 140.

In this case, the second substrate 112, which is a growing substrate for growing the semiconductor light emitting diodes 150, may be a spire substrate or a silicon substrate.

The semiconductor light emitting diodes have a gap and a size that can form a display when they are formed in a wafer unit, so they can be effectively used for a display.

Next, the wiring board and the second substrate 112 are thermally pressed. For example, the wiring board and the second substrate 112 can be thermally pressed using an ACF press head. The wiring board and the second substrate 112 are bonded by the thermal pressing. Only the portions among the semiconductor light emitting diode 150, the auxiliary electrode 170, and the second electrode 140 have conductivity by the characteristics of an anisotropic conductive film having conductivity by thermal pressing, so the electrodes and the semiconductor light emitting diodes 150 can be electrically connected. In this case, the semiconductor light emitting diodes 150 are inserted in the anisotropic conductive film, so separation walls may be formed between the semiconductor light emitting diodes 150.

Next, the second substrate 112 is removed. For example, it is possible to remove the second substrate 112 using Laser Lift-off (LLO) or Chemical Lift-off (CLO).

Finally, the semiconductor light emitting diodes 150 are exposed to the outside by removing the second substrate 112. If necessary, it is possible to form a transparent insulating layer (not shown) by coating the top of the wiring board, to which the semiconductor light emitting diodes 150 are coupled, with silicon oxide (SiOx), etc.

Further, a step of forming a fluorescent layer on a surface of the semiconductor light emitting diode 150 may be further included. For example, the semiconductor light emitting diode 150 may be a blue semiconductor light emitting diode that emits blue light (B), and a red fluorescent body or a green fluorescent body for converting the blue light (B) into the light of a sub-pixel may form a layer on a surface of the blue semiconductor light emitting diode.

The manufacturing method or structure of the display using a semiconductor light emitting diode described above can be modified in various ways. As an example, a vertical semiconductor light emitting diode can also be applied to the display described above. Hereafter, a vertical structure is described with reference to FIGS. 5 and 6.

Further, in the modification or embodiment to be described hereafter, the same or similar components are given the same or similar reference numerals, and the above description is referred to for the description.

Figure 7:
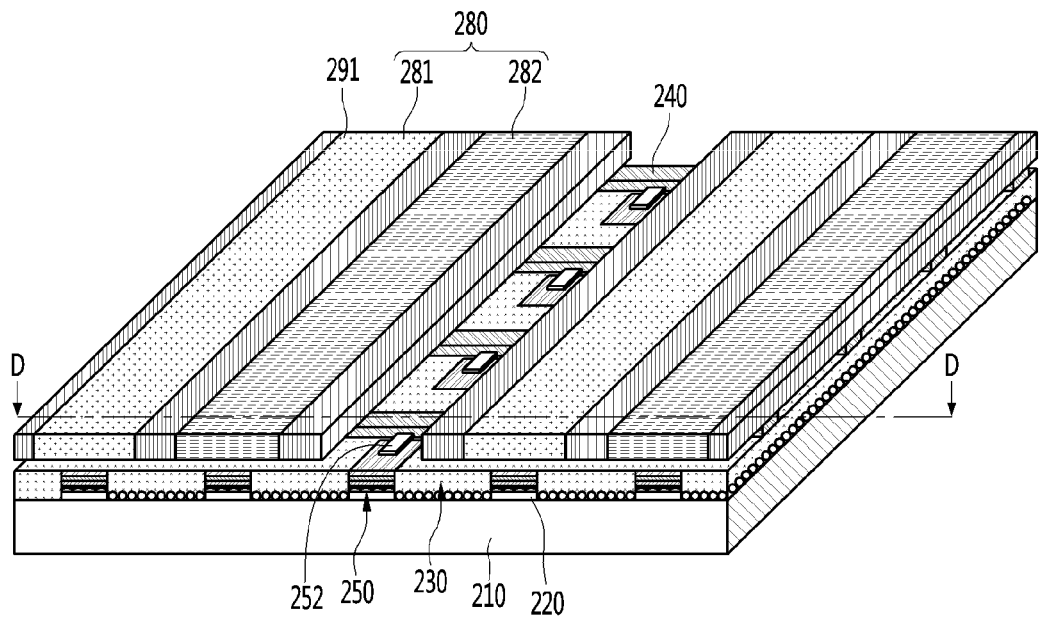
FIG. 7 is a perspective view showing another embodiment of a display using a semiconductor light emitting diode of the present disclosure.
Figure 8:
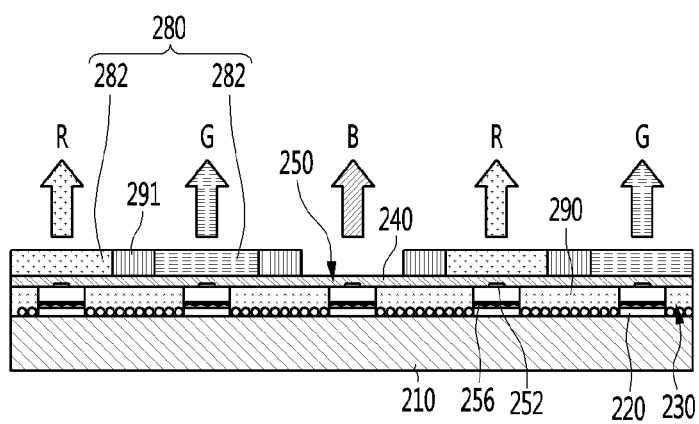
FIG. 8 is a cross-sectional view taken along line D-D of FIG. 7.
Figure 9:
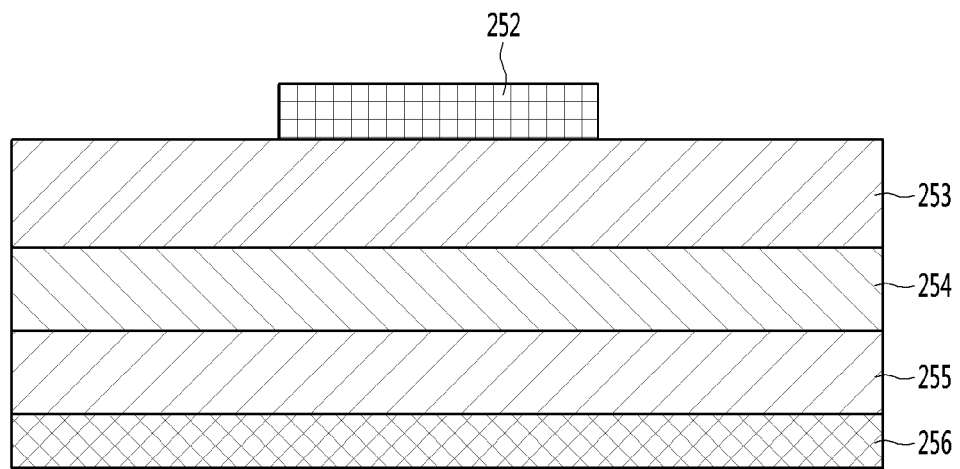
FIG. 9 is a conceptual view showing a vertical semiconductor light emitting diode of FIG. 8.

FIG. 7 is a perspective view showing another embodiment of a display using a semiconductor light emitting diode of the present disclosure, FIG. 8 is a cross-sectional view taken along line D-D of FIG. 7, and FIG. 9 is a conceptual view showing a vertical semiconductor light emitting diode of FIG. 8.

Referring to these figures, the display may be a display that uses passive matrix (PM) type of vertical semiconductor light emitting diodes.

The display includes a substrate 210, a first electrode 220, a conductive adhesive layer 230, a second electrode 240, and a plurality of semiconductor light emitting diodes 250.

The substrate 210, which is a wiring board on which the first electrode 220 is disposed, may include polyimide (PI) to implement a flexible display. Further, any materials may be used as long as they have insulation and flexibility.

The first electrode 220 is positioned on the substrate 210 and may be formed in a bar shape that is long in one direction. The first electrode 220 may be configured to function as a data electrode.

The conductive adhesive layer 230 is formed on the substrate 210 on which the first electrode 220 is positioned. Like a display to which flip-chip type light emitting diodes are applied, the conductive adhesive layer 230 may be an anisotropy conductive film (ACF), an anisotropy conductive paste, and a solution including conductive particles. However, in this embodiment, a case in which the conductive adhesive layer 230 is implemented by an anisotropic conductive film is exemplified.

An isotropic conductive film is positioned in a state in which the first electrode 220 is positioned on the substrate 210 and then the semiconductor light emitting diode 250 is connected by applying heat and pressure, the semiconductor light emitting diode 250 is electrically connected with the first electrode 220. In this case, it is preferable that the semiconductor light emitting diode 250 is disposed to be positioned on the first electrode 220.

The electrical connection, as described above, is generated because when heat and pressure are applied, the anisotropic conductive film partially has conductivity in the thickness direction. Accordingly, the anisotropic conductive film is divided into a portion having conductivity in the thickness direction and a portion not having conductivity in the thickness direction.

Further, since the anisotropic conductive film contains an adhesive component, the conductive adhesive layer 230 implements not only electrical connection, but also mechanical coupling between the semiconductor light emitting diode 250 and the first electrode 220.

As described above, the semiconductor light emitting diode 250 is positioned on the conductive adhesive layer 230, whereby it configures an individual pixel in the display. Since the semiconductor light emitting diode 250 has excellent luminance, it can constitute an individual sub-pixel even in a small size. The individual semiconductor light emitting diode 250 may have a size with one side of 80 µm or less and may be a rectangular or a square diode. When it is a rectangle, the size may be 20×80 µm or less.

The semiconductor light emitting diode 250 may be a vertical structure.

A plurality of second electrodes 240 disposed across the length direction of the first electrode 220 and electrically connected with the vertical semiconductor light emitting diodes 250 is positioned between the vertical semiconductor light emitting diodes.

Referring to FIG. 9, the vertical semiconductor light emitting diodes include a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on the n-type semiconductor layer 253. In this case, the p-type electrode 256 positioned at a lower portion can be electrically connected with the first electrode 220 by the conductive adhesive layer 230, and the n-type electrode 252 positioned at an upper portion can be electrically connected with the second electrode 240 to be described below. The semiconductor light emitting diode 250 has a large advantage in that electrodes can be disposed up and down, so the chip size can be reduced.

Referring to FIG. 8 again, a fluorescent layer 280 may be formed on a surface of the semiconductor light emitting diode 250. For example, the semiconductor light emitting diode 250 is a blue semiconductor light emitting diode 251 that emits blue light (B), and the fluorescent layer 280 for converting the blue light (B) into a color of a sub-pixel can be provided. In this case, the fluorescent layer 280 may be a red fluorescent 281 and a green fluorescent body 282 constituting an individual pixel.

That is, the red fluorescent body 281 that can convert blue light into red light (R) may be stacked on a blue semiconductor light emitting diode at a position where a red sub-pixel is formed, and the green fluorescent body 282 that can convert blue light into green light (G) may be stacked on a blue semiconductor light emitting diode at a position where a green sub-pixel is formed. Further, only a blue semiconductor light emitting diode may be independently used a portion forming a blue sub-pixel. In this case, red (R), green (G), and blue (B) sub-pixels can form one pixel.

However, the present disclosure is not necessarily limited thereto and other structures for implementing blue, green, and red, as described above, in a display to which flip-chip type light emitting diodes are applied may be applied.

According to this embodiment, the second electrodes 240 are disposed between the semiconductor light emitting diodes 250 and electrically connected with the semiconductor light emitting diodes. For example, the semiconductor light emitting diodes 250 may be disposed in a plurality of lines and the second electrodes 240 may be positioned between the lines of the semiconductor light emitting diodes 250.

Since the distance between the semiconductor light emitting diodes 250 that form individual pixels is sufficiently large, the second electrodes 240 can be positioned between the semiconductor light emitting diodes 250.

The second electrode 240 may be formed as an electrode in a bar shape that is long in one direction and may be disposed perpendicular to the first electrode.

Further, the second electrode 240 and the semiconductor light emitting diode 250 can be electrically connected by a connection electrode protruding from the second electrode 240. In more detail, the connection electrode may be the n-type electrode of the semiconductor light emitting diode 250. For example, the n-type electrode is formed as an ohmic electrode for ohmic contact and the second electrode covers at least a portion of the ohmic electrode by printing or depositing. Accordingly, the second electrode 240 and the n-type electrode of the semiconductor light emitting diode 250 can be electrically connected.

According to the figures, the second electrode 240 may be positioned on the conductive adhesive layer 230. Depending on cases, a transparent insulating layer (not shown) including silicon oxide (SiOx), etc may be formed on the substrate 210 on which the semiconductor light emitting diodes 250 are formed. When the second electrode 240 is positioned after the transparent insulating layer is formed, the second electrode 240 is positioned on the transparent insulating layer. Further, the second electrodes 240 may be formed to be spaced apart from each other on the conductive adhesive layer 230 or the transparent insulating layer.

If a transparent electrode such as ITO (Indium Tin Oxide) is used to position the second electrode 240 on the semiconductor light emitting diode 250, there is a problem in that the ITO substance is not bonded well to a semiconductor layer. Accordingly, the present disclosure has the advantage that there is no need for using a transparent electrode such as ITO by positioning the second electrode 240 between the semiconductor light emitting diodes 250. Accordingly, it is possible to improve optical extraction efficiency by using a conductive substance, which is bonded well to an n-type semiconductor layer, as a horizontal electrode without being limited to selection of a transparent material.

According to the figures, a separation wall 290 may be positioned between the semiconductor light emitting diodes 250. That is, the separation wall 290 may be disposed between the vertical semiconductor light emitting diodes 250 to isolate the semiconductor light emitting diodes 250 forming individual pixels. In this case, the separation wall 290 can serve to separate individual sub-pixels and may be formed integrally with the conductive adhesive layer 230. For example, the semiconductor light emitting diodes 250 are inserted in the anisotropic conductive film, the base member of the anisotropic conductive film can form the separation wall.

Further, when the base member of the anisotropic conductive film is black, the separation wall 290 can have a reflective characteristic and the contrast can be increased even without a discrete black insulator.

As another example, a reflective separation wall may be provided as the separation wall 190. The separation wall 290 may include a black or white insulator, depending on the object of the display.

If the second electrode 240 is positioned directly on the conductive adhesive layer 230 between the semiconductor light emitting diodes 250, the separation wall 290 may be positioned between each of the semiconductor light emitting diodes 250 and the second electrodes 240. Accordingly, there is an effect that it is possible to configure individual sub-pixels even in a small size using the semiconductor light emitting diodes 250, it is possible to position the second electrode 240 between the semiconductor light emitting diodes 250 because the distance of the semiconductor light emitting diodes 250 is relatively larger, and it is possible to implement a flexible display having HD quality.

Further, according to the figures, a black matrix 291 may be disposed between fluorescent bodies to improve contrast. That is, the black matrix 291 can improve the contrast of light and darkness.

As described above, the semiconductor light emitting diode 250 is positioned on the conductive adhesive layer 230, whereby it configures an individual pixel in the display. Since the semiconductor light emitting diode 250 has excellent luminance, it can constitute an individual sub-pixel even in a small size. Accordingly, a full-color display in which red (R), green (G), and blue (B) sub-pixels form one pixel by semiconductor light emitting diodes can be implemented.

Figure 10:
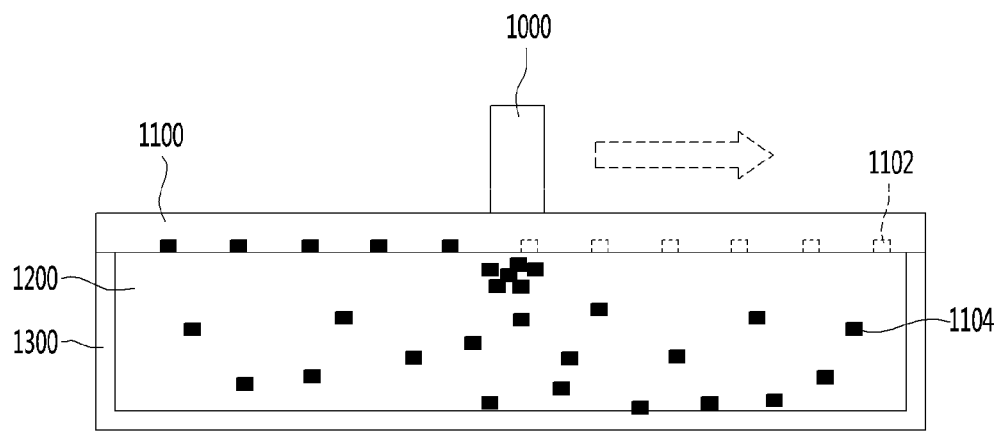
FIG. 10 is a view schematically showing an embodiment of a method in which a semiconductor light emitting diode is assembled to a display panel by a self-assembling type.

FIG. 10 is a view schematically showing an embodiment of a method in which a semiconductor light emitting diode is assembled to a display panel by a self-assembling type.

An example in which a semiconductor light emitting diode is assembled to a display panel by a self-assembling type using an electromagnetic file is briefly described with reference to FIG. 10.

Referring to FIG. 10, a semiconductor light emitting diode 1104 can be put into a chamber 1300 filled with fluid 1200.

The semiconductor light emitting diode 1104 may be implemented as the horizontal semiconductor light emitting diode shown in FIG. 4 or the vertical semiconductor light emitting diode shown in FIG. 9. Further, the semiconductor light emitting diode 1104 may include a magnetic layer having a magnetic member. The magnetic layer may include metal having magnetism such as nickel Ni. Since the semiconductor light emitting diode 1104 put into the fluid includes a magnetic layer, it can be moved to the panel 1100 by a magnetic field generated from an assembly apparatus 1000, so it can be assembled to the panel 1100.

Thereafter, the panel 1100 (or a substrate) can be disposed on the chamber 1300. Depending on embodiments, the panel 1100 may be put into the chamber 1300.

A pair of assembly electrodes (not shown) respectively corresponding to the semiconductor light emitting diodes 1104 to be assembled may be formed on the panel 1100. The assembly electrodes may be implemented by ITO or may be implemented by other common materials. The assembly electrodes may correspond to a pair of assembly electrodes that fixes the assembled semiconductor light emitting diode 1104 to the panel 1100 by emitting an electric field when a voltage is applied. The gap between the assembly electrodes is smaller than the width of the semiconductor light emitting diode 1104 and the width of a coupling hole 1102, so it is possible to more precisely fix the assembly position of the semiconductor light emitting diode 1104 using an electric field.

The coupling holes 1102 to which the semiconductor light emitting diodes 1140 are coupled are formed in the panel 1100 and the surface on which the coupling holes 1102 are formed can come in contact with the fluid 1200. The coupling holes can guide the accurate assembly positions of the semiconductor light emitting diodes 1140. For example, the coupling hole 1102 may be formed by a separation wall 190 (see FIG. 3B) formed on the substrate of the panel 1100.

Meanwhile, the coupling hole 1102 may have a shape and a size that correspond to the shape of the semiconductor light emitting diode 1104 to be assembled at a corresponding position. Accordingly, it is possible to prevent other semiconductor light emitting diodes or a plurality of semiconductor light emitting diodes from being coupled to the coupling hole 1102.

After the panel 1100 is disposed, the assembly apparatus 1000 including a magnetic member can move along the panel 1100. The assembly apparatus 1000 can move in contact with the panel 1100 to maximize the area that a magnetic field reaches to the inside of the fluid 1200. Depending on embodiments, the assembly apparatus 1000 may include a plurality of magnetic members or a magnetic member having a size corresponding to the panel 1100. In this case, the movement distance of the assembly apparatus 1000 may be limited within a predetermined range.

The semiconductor light emitting diode 1104 in the chamber 1300 can be moved toward the assembly apparatus 1000 by the magnetic field generated by the assembly apparatus 1000.

The semiconductor light emitting diode 1104 can be inserted into the coupling hole 1102 and brought in contact with the panel 1100 while moving toward the assembly apparatus 1000. For example, a pattern or a shape for the n-type semiconductor layer of the semiconductor light emitting diode 1104 to come in contact with the panel 1100 may be formed in the coupling hole 1102 and/or the semiconductor light emitting diode 1104.

Further, the semiconductor light emitting diode 1104 being in contact with the panel 1100 can be fixed to the panel 1100 without being separated due to movement of the apparatus 1000 by the electric field that is applied through the assembly electrodes formed on the panel 1100. Accordingly, the semiconductor light emitting diode 1104 can be assembled to the panel 1100.

That is, by the self-assembling type that uses an electromagnetic field, it is possible to remarkably reduce the time that is taken to assemble each of the semiconductor light emitting diodes to the substrate, so it is possible to quickly and economically implement a large-area and high-pixel display.

Hereafter, the assembly apparatus 1000 shown in FIG. 10 is described in more detail with reference to FIGS. 11 to 19.

Figure 11:
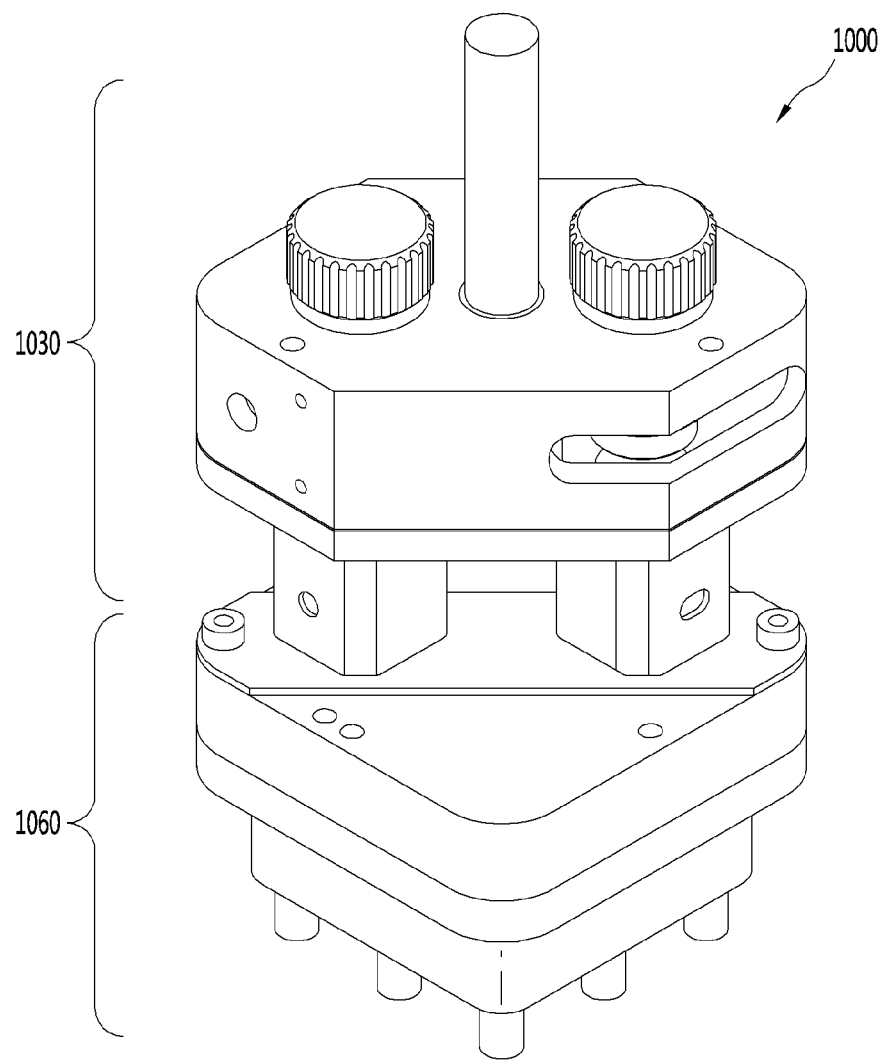
FIG. 11 is a perspective view of an assembly apparatus according to an embodiment of the present invention.

FIG. 11 is a perspective view of an assembly apparatus according to an embodiment of the present invention.

Referring to FIG. 11, the assembly apparatus 1000 may include a rotary module 1030 and an assembly module 1060. The rotary module 1030 can rotate the assembly module 1060 connected with the rotary module 1030 using a driving force that is provided from the outside.

The assembly module 1060 can be rotated transversely by the rotary module 1030. In particular, the assembly module 1060 may be connected to the rotary shaft of the rotary module 1030 at a predetermined distance. In this case, the assembly module 1060 can rotate along an orbit (orbit motion) when the rotary module 1030 rotates.

A magnetic member is provided under the assembly module 1060 and can rotate along the orbit in contact with the panel 1100. The semiconductor light emitting diodes 1104 in the fluid can be moved toward the magnetic member by the magnetic field generated from the magnetic member. Further, when the magnetic member rotates along the orbit, the semiconductor light emitting diodes 1104 can also move in correspondence to rotation of the magnetic member. The semiconductor light emitting diodes 1104 are inserted into the coupling holes 1102 of the panel 1100 while moving, whereby they can be assembled to the panel 1100.

Figure 12:
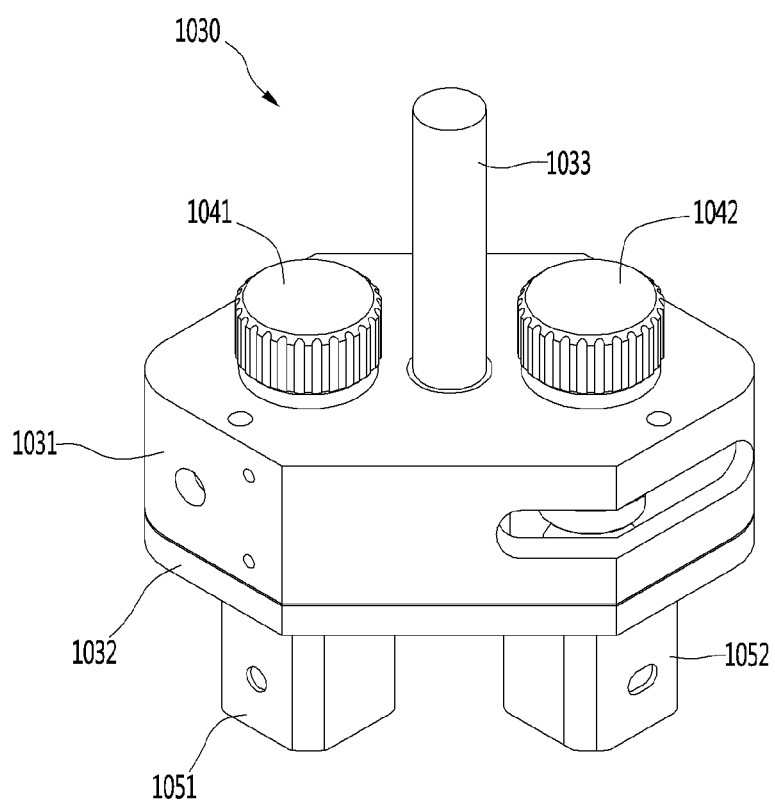
FIG. 12 is a perspective view of a rotary module included in the assembly apparatus of FIG. 11.
Figure 13:
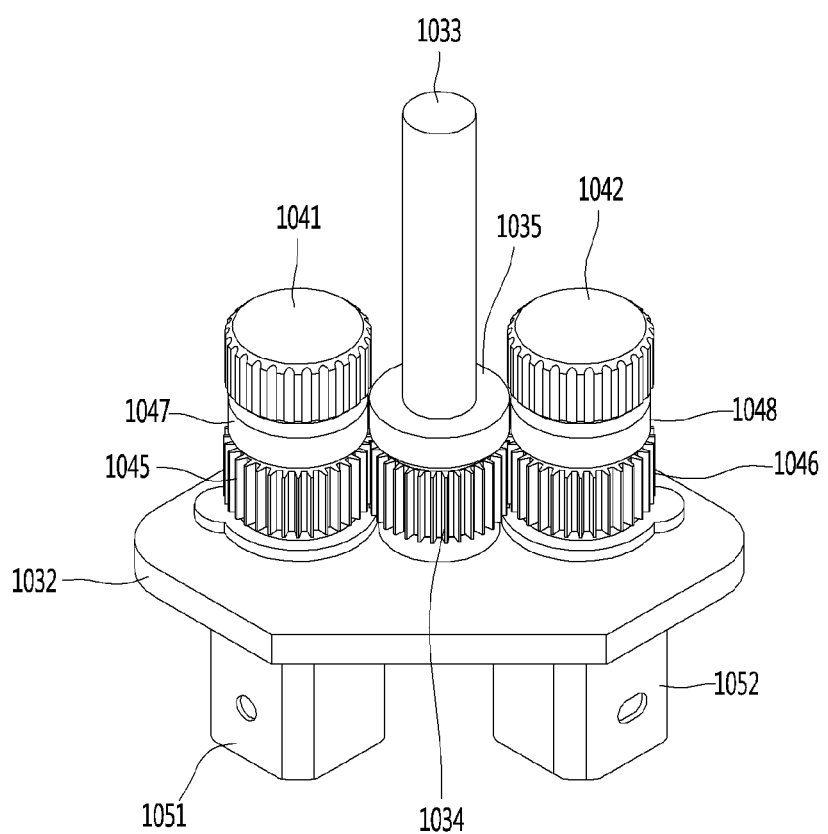
FIG. 13 is a view showing an example of a rotary structure of the rotary module shown in FIG. 12.
Figure 14:
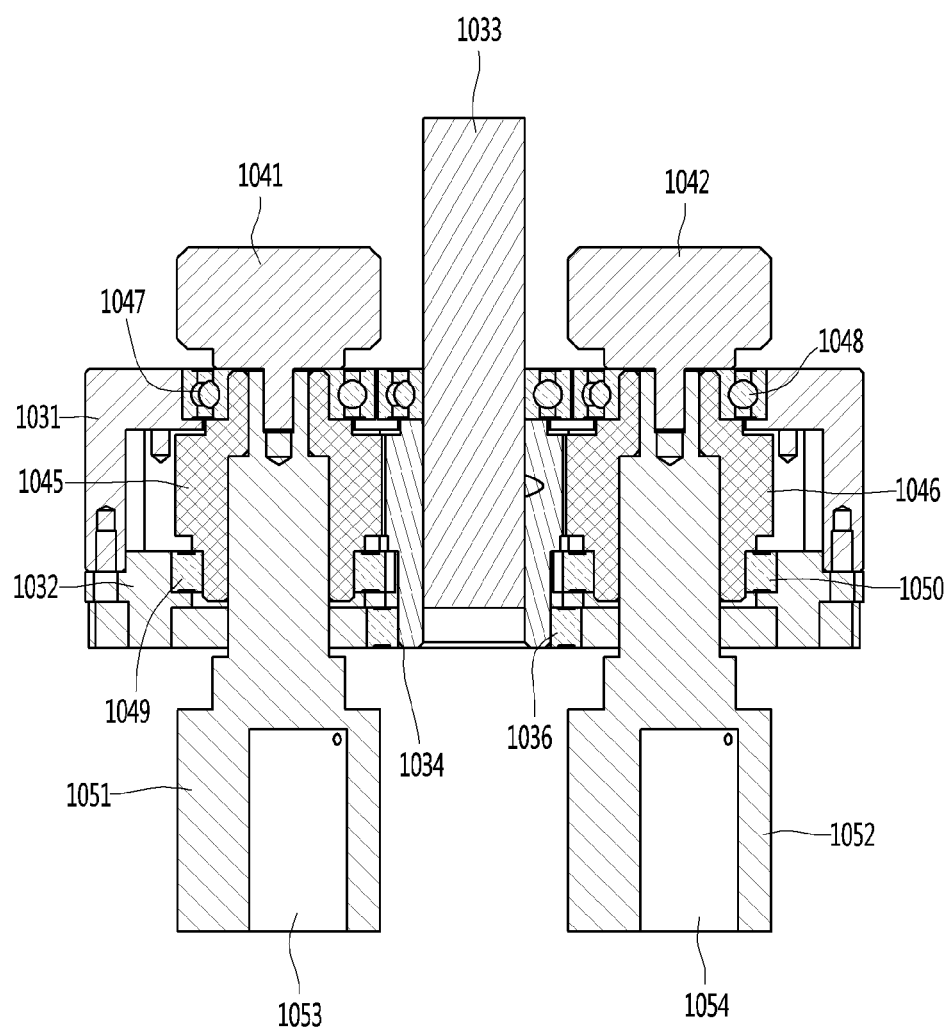
FIG. 14 is a cross-sectional view of the rotary module shown in FIG. 12.

FIG. 12 is a perspective view of the rotary module included in the assembly apparatus of FIG. 11. FIG. 13 is a view showing an example of a rotary structure of the rotary module shown in FIG. 12. FIG. 14 is a cross-sectional view of the rotary module shown in FIG. 12.

Referring to FIGS. 12 to 14, the rotary module 1030 may include a housing 1031 and a frame 1032 fastened to the lower portion of the housing 1031.

The housing 1031 and the frame 1032 can form an accommodation space therein in which a plurality of gears 1034, 1045, and 1046 is accommodated.

The rotary module 1030 may include a bar 1033 that is rotated by a driving force that is transmitted from an external driving source. For example, the bar 1033 may be implemented as a circular bar. Hereafter, it is assumed in the following description that the bar 1033 is a circular bar 1033.

The circular bar 1033 may have an end fixed to a main gear 1034 and another end connected to an external driving force supplier (not shown).

A through-hole through which the circular bar 1033 passes may be formed at the upper portion of the housing 1031 and the circular bar 1033 may be fixed to the main gear 1034 accommodated in the housing 1031 through the through-hole.

The circular bar 1033 can be rotated by the external driving force supplier. The longitudinal direction of the circular bar 1033 may correspond to a rotational axis. As the circular bar 1033 is rotated, the main gear 1034 fixed to the circular bar 1033 can also be rotated.

Depending on embodiments, fixing members 1035 and 1036 that restrict vertical movement of the main gear 1034 and prevent rotation of the main gear 1034 may be provided over and under the main gear 1034.

Keeping referring to FIGS. 12 to 14, the rotary module 1030 may include a first auxiliary gear 1045 and a second auxiliary gear 1046 geared with the main gear 1034. The first auxiliary gear 1045 and the second auxiliary gear 1046 can rotate in the opposite direction to the rotation direction of the main gear 1034. That is, the rotation direction of the first auxiliary gear 1045 and the rotation direction of the second auxiliary gear 1046 may be the same.

Depending on embodiments, fixing members 1047, 1048, 1049, and 1050 that restrict vertical movement and prevent separation of the first auxiliary gear 1045 and the second auxiliary gear 1046 may be provided respectively over and under the first auxiliary gear 1045 and the second auxiliary gear 1046.

A first connection shaft 1051 may be fixed to the first auxiliary gear 1045 and a second connection shaft 1052 may be fixed to the second auxiliary gear 1046. The first connection shaft 1051 and the second connection shaft 1052 can be rotated in correspondence to rotation of the first auxiliary gear 1045 and the second auxiliary gear 1046, respectively. That is, the rotary module 1030 and the assembly module 1060 are connected at a plurality of positions, the connection stability can be improved.

The first connection shaft 1051 and the second connection shaft 1052 can be connected with the assembly module 1060. In detail, a first fastening hole 1053 in which the first shaft 1062 (see FIG. 15) of the assembly module 1060 may be formed in the first connection shaft 1051. Similarly, a second fastening hole 1054 in which the second shaft 1063 (see FIG. 15) of the assembly module 1060 may be formed in the second connection shaft 1052.

In particular, the centers of the first fastening hole 1053 and the second fastening hole 1054 may be spaced apart from the rotational axes of the first connection shaft 1051 and the second connection shaft 1052, respectively. That is, as shown in FIG. 14, the first fastening hole 1053 and the second fastening hole 1054 may be formed to be deviated from the centers of the first connection shaft 1051 and the second connection shaft 1052. Accordingly, the first shaft 1062, the second shaft 1063, and the assembly modules 1060 including the shafts can rotate along a predetermined orbit (orbit motion) when the first connection shaft 1051 and the second connection shaft 1052 are rotated.

Meanwhile, depending on embodiments, the rotary module 1030 and the assembly module 1060 may be connected at one position. In this case, the rotary module 1030 may not include the auxiliary gears 1045 and 1046, and one main shaft may be fixed to the main gear 1034. Further, only one shaft that is inserted in the one connection shaft may be formed at the assembly module 1060.

Depending on embodiments, connection shaft fixers 1041 and 1042 that prevent serration of the first connection shaft 1051 and the second connection shaft 1052 may be fastened to the upper portions of the first connection shaft 1051 and the second connection shaft 1052, respectively.

Figure 15:
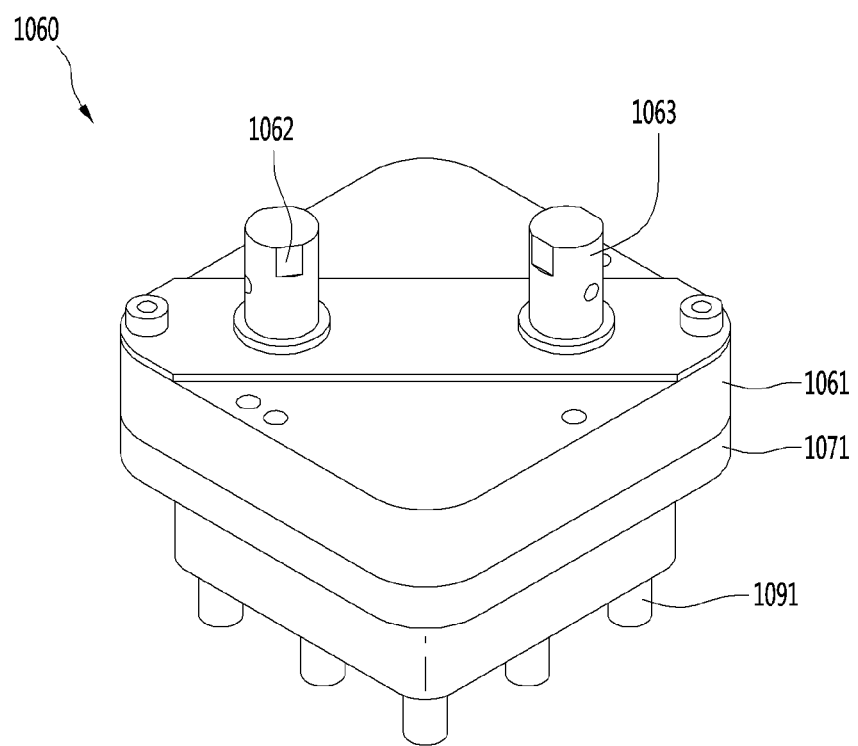
FIG. 15 is a perspective view of an assembly module included in the assembly apparatus of FIG. 11.
Figure 16:
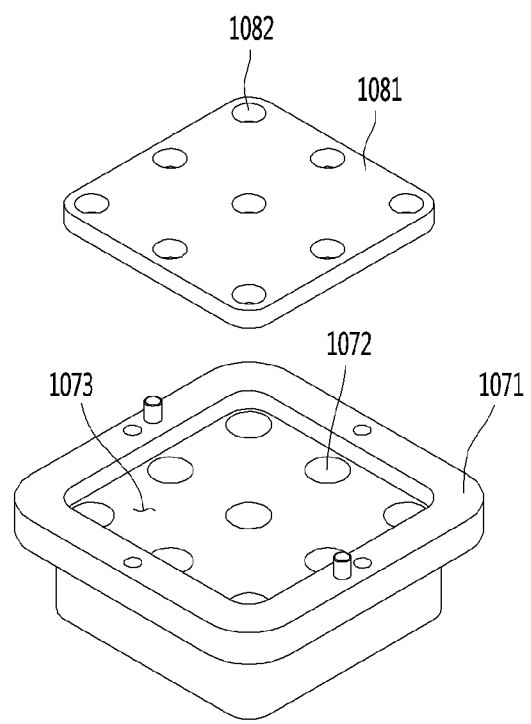
FIG. 16 is a view showing a magnetic member accommodator and a magnetic member attachment plate included in the assembly module of FIG. 15.
Figure 17:
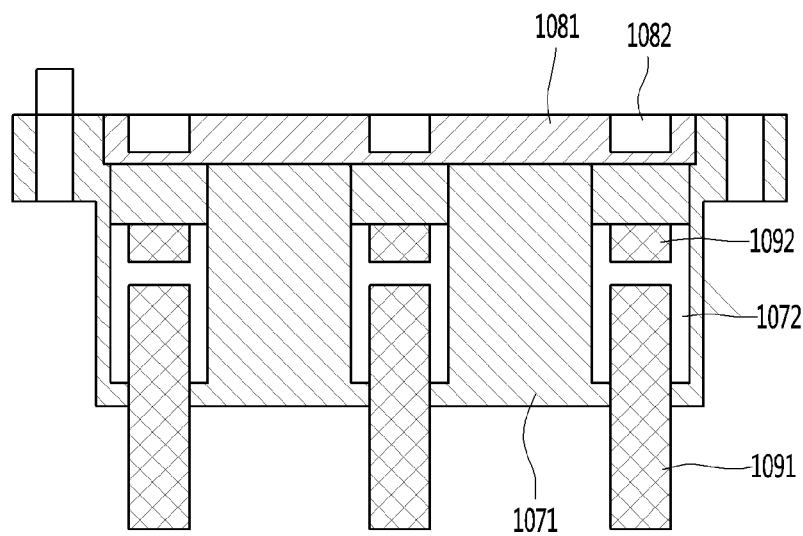
FIG. 17 is a cross-sectional view showing a portion of the assembly module of FIG. 15.

FIG. 15 is a perspective view of an assembly module included in the assembly apparatus of FIG. 11. FIG. 16 is a view showing a magnetic member accommodator and a magnetic member fixing plate included in the assembly module of FIG. 15. FIG. 17 is a cross-sectional view showing a portion of the assembly module of FIG. 15.

Referring to FIGS. 15 to 17, the rotary module 1060 may include a housing 1061 forming the entire external appearance and a magnetic member accommodator 1071 fastened to the lower portion of the housing 1061.

A first shaft 1062 and a second shaft 1063 can be fastened to the housing 1061. Meanwhile, in order that the assembly module 1060 rotates along an orbit (orbit motion) when the connection shafts 1051 and 1052 of the rotary module 1030 are rotated, the first shaft 1062 and the second shaft 1063 can be fastened or inserted to be able to rotate with respect to any one of the housing 1061 or the connection shafts 1051 and 1052.

The magnetic member accommodator 1071 may be fastened to the lower portion of the housing 1061. A least one magnetic member accommodation hole 1072 accommodating a magnetic member may be formed in the magnetic member accommodator 1071.

Further, an accommodation space 1073 recessed from the top and accommodating a magnetic member fixing plate 1081 may be formed on the magnetic member accommodator 1071. The accommodation space 1073 may be formed on at least one magnetic member accommodation hole 1072. The housing 1061 is positioned over the magnetic member fixing plate 1081 accommodated in the accommodation space 1073, so the magnetic member fixing plate 1081 can be prevented from separating outside.

For example, the magnetic member fixing plate 1081 is made of magnetic metal, so at least one fixed magnetic member 1092 can be fixed in the magnetic member accommodator 1071. For example, the at least one fixed magnetic member 1092 can be attached and fixed to the bottom of the magnetic member fixing plate 1081 by attraction of the magnetic member fixing plate 1081.

Depending on embodiments, the magnetic member fixing plate 1081 may further include at least one magnetic member accommodation groove 1082 formed at a position corresponding to the at least one magnetic member accommodation hole 1072 formed in the magnetic member accommodator 1071. In this case, the at least one fixed magnetic member 1092 may be accommodated in the at least one magnetic member accommodation groove 1082.

Referring to FIG. 17, a moving magnetic member 1091 and the fixed magnetic member 1092 can be provided in the at least one magnetic member accommodation hole 1072. The moving magnetic member 1091 may partially protrude downward from the magnetic member accommodator 1071 and the fixed magnetic member 1092 may be attached and fixed to the bottom of the magnetic member fixing plate 1081.

The same polarity may be formed on the cross-sections facing each other of the moving magnetic member 1091 and the fixed magnetic member 1092. Accordingly, repulsion acts between the moving magnetic member 1091 and the fixed magnetic member 1092, so the moving magnetic member 1091 can be spaced a predetermined distance apart from the fixed magnetic member 1092 unless another force is applied from the outside. In this case, even if the contact surface of the panel 1100 that the assembly apparatus 1000 comes in contact is not uniform due to bending, etc., the moving magnetic member 1091 can smoothly come in contact with the contact surface.

The moving magnetic member 1091 and the fixed magnetic member 1092 may be defined as a kind of shock-absorbing module. The effect by the shock-absorbing module implemented in the assembly module 1060 is described below in more detail with reference to FIGS. 19 and 20.

Figure 18:
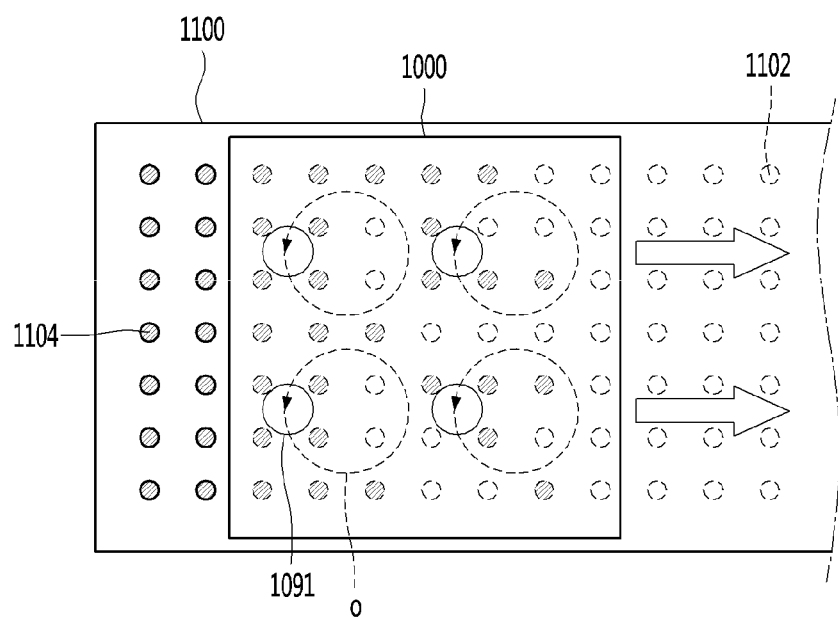
FIG. 18 is a view schematically showing an orbit motion of a magnetic member according to driving of the assembly apparatus and an assembly operation of a semiconductor light emitting diode based on the orbit motion.

FIG. 18 is a view schematically showing an orbit motion of a magnetic member according to driving of the assembly apparatus and an assembly operation of a semiconductor light emitting diode based on the orbit motion.

FIG. 18 shows an assembly operation of a semiconductor light emitting diode from above. Referring to FIG. 18, the panel 1100 may be disposed to face the lower portion of the coupling hole 1102. Accordingly, the coupling hole 1102 may be in contact with the fluid 1200 or put in the fluid 1200.

Meanwhile, when a semiconductor light emitting diode is assembled, the assembly apparatus 1000 may be disposed such that the moving magnetic member 1091 is in contact with the panel 1100. When the moving magnetic member 1091 is disposed in contact with the panel 1100, the semiconductor light emitting diode 1104 existing in the fluid 1200 can be moved to the panel 1100 by a magnetic field. The semiconductor light emitting diode 1104 moving toward the panel 1100 can enter the coupling hole 1102 formed in the panel 1100. The semiconductor light emitting diode 1104 entering the coupling hole 1102 can be fixed in the coupling hole 1102 by the electric field applied through the assembly electrodes (not shown) formed on the panel 1100.

Meanwhile, the circular bar 1033 of the assembly apparatus 1000 can be rotated by a driving force that is provided from the outside. In this case, the main gear 1034 to which the circular bar 1033 is fixed can also be rotated, and the first auxiliary gear 1045 and the second auxiliary gear 1046 geared with the main gear 1034 can also be rotated.

As the first auxiliary gear 1045 and the second auxiliary gear 1046 are rotated, the first connection shaft 1051 connected to the first auxiliary gear 1045 and the second connection shaft 1052 connected to the second auxiliary gear 1046 can be rotated. The assembly module 1060 connected with the first connection shaft 1051 and the second connection shaft 1052 can rotate along a predetermined orbit when the first connection shaft 1051 and the second connection shaft 1052 are rotated.

In this case, the at least one moving magnetic member 1091 provided in the assembly module 1060 can rotate along the predetermined orbit O. Since the at least one moving magnetic member 1091 rotates along the predetermined orbit O, the semiconductor light emitting diode 1104 can be more effectively assembled to the coupling hole 1102 while horizontally moving in contact with the panel 1100. Further, the assembly apparatus 1000 can effectively assemble semiconductor light emitting diodes into coupling holes having a wider areas using a limited number of moving magnetic members 1091. Depending on embodiments, the assembly apparatus 1000 can assemble semiconductor light emitting diodes into coupling holes in various regions while moving in a predetermined direction.

That is, according to an embodiment of the present disclosure, the assembly apparatus 1000 includes at least one magnetic member 1091 moving in contact with the panel 1100, so it is possible to effectively guide the semiconductor light emitting diodes 1104 accommodated in the fluid 1200 toward the panel using a magnetic field. Accordingly, the assembly apparatus 100 enables the semiconductor light emitting diodes 1104 to be more easily assembled to the panel 1100, so it is possible to remarkably reduce a process time of a transfer process.

Figure 19:
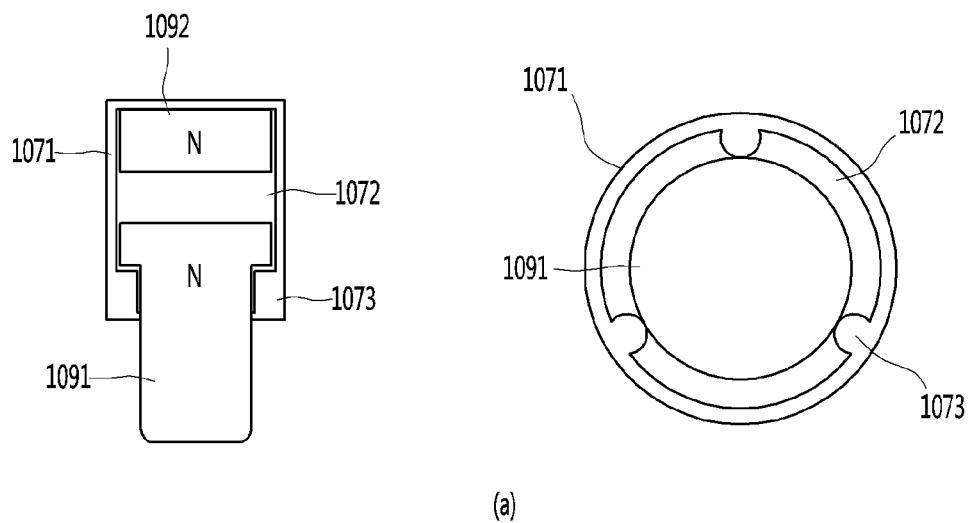
FIG. 19 shows exemplary views related to a shock-absorbing module included in the assembly module of FIG. 15.
Figure 19:
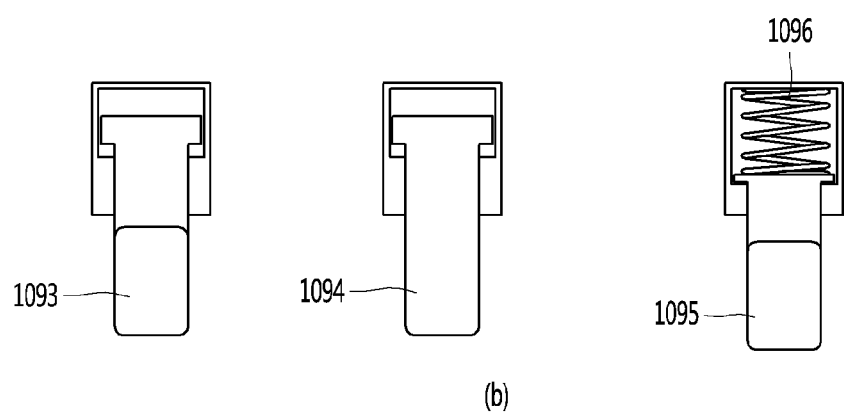

FIG. 19 shows exemplary views related to a shock-absorbing module included in the assembly module of FIG. 15.

Referring to (a) of FIG. 19, a shock-absorbing module may include the moving magnetic member 1091 and the fixed magnetic member 1092. The fixed magnetic member 1092 may be attached and fixed to the magnetic member fixing plate 1081 and the moving magnetic member 1091 may be implemented to be movable vertically by a predetermined length on the basis of the repulsion from the fixed magnetic member 1092 and the force applied from the contact surface of the panel 1100.

Meanwhile, in order to prevent the moving magnetic member 1091 from separating downward from the magnetic member accommodation hole 1072, the upper radius may be larger than the lower radius of the moving magnetic member 1091. Further, at least one protrusion 1073 that protrudes from the inner circumferential surface may be formed at the lower portion of the magnetic member accommodation hole 1072. The at least one protrusion 1073 is in contact with the outer circumferential surface of the moving magnetic member 1091, thereby restricting inclination or horizontal vibration of the moving magnetic member 1091 and preventing separation of the moving magnetic member 1091. Accordingly, the protrusion 1073 can stably keep the moving magnetic member 1091 at the position.

The inner diameter of the magnetic member accommodation hole 1072 defined with respect to the at least one protrusion 1073 may correspond to the lower outer diameter of the moving magnetic member 1091 and may be smaller than the outer diameter of the moving magnetic member 1091.

On the other hand, referring to (b) of FIG. 19, the assembly apparatus 1000 may include various types of shock-absorbing modules. For example, the shock-absorbing modules may have a magnetic member 1093 and an anti-separator or may have only a moving magnetic member 1091.

Alternatively, the shock-absorbing modules may include a magnetic member 1095, and a spring 1096 connected between the magnetic member 1095 and the magnetic member accommodator 1071 or the magnetic member fixing plate 1081. In this case, the magnetic member 1095 may be implemented to be movable vertically by a predetermined length on the basis of the elastic restoring force of the spring 1096 and the force applied from the contact surface of the panel 1100.

Figure 20:
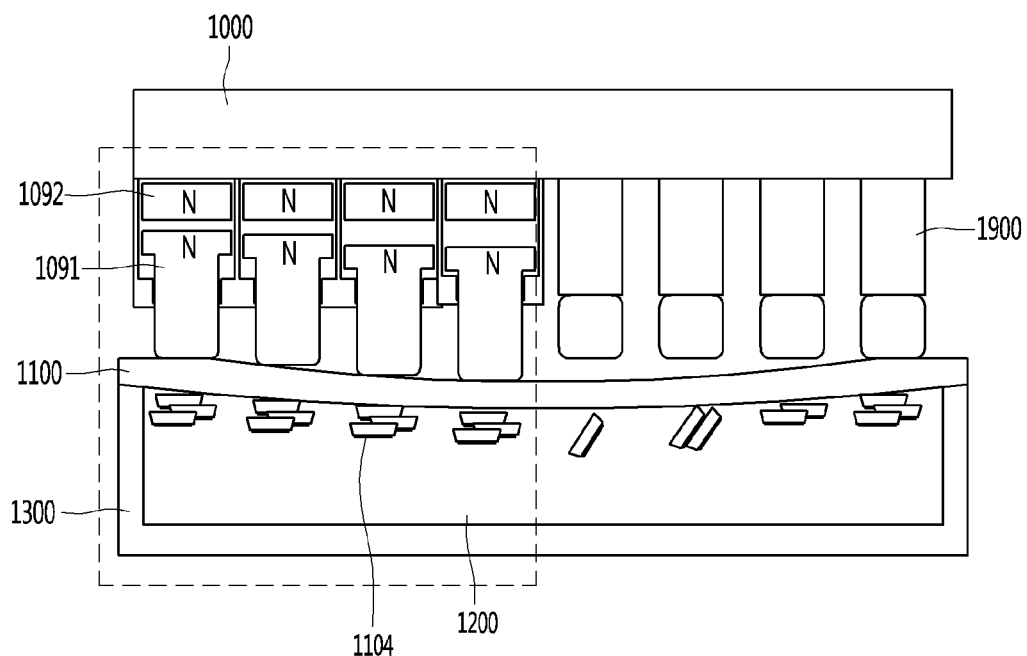
FIG. 20 is an exemplary view showing an effect according to implementation of the shock-absorbing module of FIG. 18.

FIG. 20 is an exemplary view showing an effect according to implementation of the shock-absorbing module of FIG. 18.

Referring to FIG. 20, the panel 1100 may be positioned over the fluid 1200 and the chamber 1300 to assemble the semiconductor light emitting diode 1104. For example, the outer edge of the panel 1100 may be seated in the chamber 1300 and the center portion may be positioned over the fluid 1200. Meanwhile, the larger the area of the display to be manufactured, the larger the area of the panel 1100 can also be. Further, the thickness of the panel 1100 is very small in comparison to the area, so the center portion may be bent when the panel 1100 is positioned over the fluid 1200 and the chamber 1300.

When the assembly apparatus 1000 has only the fixed magnetic member 1900, as at the right side of FIG. 20, some of the plurality of magnetic members 1900 may be spaced a predetermined distance apart from the panel 1100 without being in contact with the panel 1100. In this case, the magnetic field applied from the magnetic member 1900 is not transmitted into the fluid 1200, the semiconductor light emitting diode 1104 may not be smoothly guided toward the panel 1100. As a result, the assembly ratio of the semiconductor light emitting diodes may be deteriorated.

On the contrary, according to an embodiment of the present disclosure, since the shock-absorbing module is formed in the assembly apparatus 1000, the plurality of moving magnetic members 1091 can smoothly come in contact with the panel 1100 even if the panel 1100 is bent. Accordingly, the assembly apparatus 1000 can smoothly guide the semiconductor light emitting diode 1104 in the fluid 1200 toward the panel 1100 and can prevent deterioration of the assembly ratio of the semiconductor light emitting diodes when manufacturing a large-area display.

According to an embodiment of the present disclosure, the assembly apparatus includes at least one magnetic member that moves in contact with the panel, so it can effectively guide the semiconductor light emitting diodes accommodated in the fluid toward the panel using a magnetic field. Accordingly, the assembly apparatus can remarkably reduce the process time of a transfer process by enabling semiconductor light emitting diodes to be more easily assembled to the panel.

Further, since the assembly apparatus rotates the assembly module and at least one moving magnetic member provided in the assembly module along a predetermined orbit, semiconductor light emitting diodes can be effectively accommodated and assembled in the coupling holes while horizontally moving in contact with the panel. Further, since the assembly apparatus rotates a limited number of moving magnetic members along an orbit, it can effectively assemble semiconductor light emitting diodes into coupling holes having a wider area.

Further, since the shock-absorbing module is formed at the lower portion of the assembly apparatus, a plurality of magnetic members can smoothly come in contact with the panel even if the contact surfaces are different in height due to bending of the panel, etc. Accordingly, since the assembly apparatus can smoothly guide the semiconductor light emitting diode in the fluid toward the panel, it can prevent deterioration of the assembly ratio of the semiconductor light emitting diodes when manufacturing a large-area display.

The above description merely explains the spirit of the present disclosure and the present disclosure may be changed and modified in various ways without departing from the spirit of the present disclosure by those skilled in the art.

Accordingly, the embodiments described herein are provided merely not to limit, but to explain the spirit of the present disclosure, and the spirit of the present disclosure is not limited by the embodiments.

The protective range of the present invention should be construed by the following claims and the scope and spirit of the present disclosure should be construed as being included in the patent right of the present disclosure.

What is claimed is:

1. An assembly apparatus for assembling a semiconductor light emitting diode to a display panel, the assembly apparatus comprising:
   an assembly module including at least one magnetic member and a magnetic member accommodator having at least one magnetic member accommodation hole, wherein the at least one magnetic member is operatively configured to come in contact with a surface of the display panel; and
   a rotary module including a gear and a shaft, and connectively attached to the assembly module, the rotary module configured to rotate the assembly module along an orbit,
   wherein the assembly module comprises a magnetic member fixing plate and a housing fastened to an upper portion of the at least one magnetic member, and
   wherein the rotary module comprises a bar and a main gear to which the bar is fixed.

2. The assembly apparatus of claim 1, wherein the at least one magnetic member of the assembly module protrudes downward from the magnetic member accommodator through the at least one magnetic member accommodation hole.

3. The assembly apparatus of claim 2, wherein, in the magnetic member, a radius of a first portion accommodated in the magnetic member accommodation hole is larger than a radius of a second portion protruding downward from the magnetic member accommodation hole.

4. The assembly apparatus of claim 3, wherein at least one protrusion protruding from an inner circumferential surface is formed at a lower portion of the magnetic member accommodation hole.

5. The assembly apparatus of claim 4, wherein a lower inner diameter of the magnetic member accommodation hole based on the at least one protrusion is smaller than the radius of the first portion of the magnetic member.

6. The assembly apparatus of claim 1, wherein the assembly module further includes the magnetic member fixing plate accommodated in an accommodation space recessed on an upper portion of the magnetic member accommodator, and the magnetic member fixing plate is made of metal.

7. The assembly apparatus of claim 6, wherein the assembly module further includes at least one fixing magnetic member accommodated in the at least one magnetic member accommodation hole and attached to a bottom of the magnetic member fixing plate.

8. The assembly apparatus of claim 7, wherein the at least one magnetic member is positioned under at least one fixed magnetic member, and the at least one magnetic member and the at least one fixed magnetic member have the same polarity on surfaces thereof facing each other.

9. The assembly apparatus of claim 8, wherein the at least one magnetic member can be moved up and down on the basis of repulsion by the at least one fixed magnetic member and external force.

10. The assembly apparatus of claim 1, wherein the assembly module further includes the housing fastened to an upper portion of the magnetic member accommodator and at least one shaft fastened between the housing and the rotary module.

11. The assembly apparatus of claim 10, wherein the rotary module further includes:
   at least one auxiliary gear geared with the main gear; and
   at least one connection shaft fixed to the at least one auxiliary gear, and
   wherein the at least one shaft is connected with the at least one connection shaft.

12. The assembly apparatus of claim 11, wherein the at least one shaft is connected with the at least one connection shaft to be spaced apart from a rotational center of the at least one connection shaft.

13. The assembly apparatus of claim 11, wherein a fastening groove in which the at least one shaft is inserted is formed at a lower portion of the at least one connection shaft.

14. The assembly apparatus of claim 13, wherein a center of the fastening groove is spaced apart from a rotational axis of the at least one connection shaft.

15. The assembly apparatus of claim 1, wherein the assembly module further includes at least one fixing magnetic member accommodated in the at least one magnetic member accommodation hole, and
   wherein the at least one magnetic member is positioned under the at least one fixed magnetic member.

16. The assembly apparatus of claim 15, wherein the at least one magnetic member and the at least one fixed magnetic member have the same polarity on surfaces thereof facing each other.

17. The assembly apparatus of claim 16, wherein the at least one magnetic member is to be moved up and down on a basis of repulsion by the at least one fixed magnetic member and external force.

* * * * *